US006853033B2

(12) United States Patent
Liang et al.

(10) Patent No.: US 6,853,033 B2
(45) Date of Patent: Feb. 8, 2005

(54) POWER MOSFET HAVING ENHANCED BREAKDOWN VOLTAGE

(75) Inventors: Yung Chii Liang, Singapore (SG); Ganesh Shankar Samudra, Singapore (SG); Kian Paau Gan, Singapore (SG); Xin Yang, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 10/162,137

(22) Filed: Jun. 4, 2002

(65) Prior Publication Data

US 2003/0006453 A1 Jan. 9, 2003

Related U.S. Application Data

(60) Provisional application No. 60/295,581, filed on Jun. 5, 2001.

(51) Int. Cl.[7] .............................................. H01L 29/76
(52) U.S. Cl. ......................... 257/339; 257/341; 257/488
(58) Field of Search ................................. 257/339, 341, 257/343, 488

(56) References Cited

U.S. PATENT DOCUMENTS

| 4,754,310 A | | 6/1988 | Coe | |
|---|---|---|---|---|
| 5,216,275 A | | 6/1993 | Chen | |
| 5,438,215 A | | 8/1995 | Tihanyi | |
| 5,637,898 A | | 6/1997 | Baliga | |
| 5,998,833 A | * | 12/1999 | Baliga | 257/329 |
| 6,452,230 B1 | * | 9/2002 | Boden, Jr. | 257/341 |
| 6,462,377 B2 | * | 10/2002 | Hurkx et al. | 257/339 |
| 6,501,129 B2 | * | 12/2002 | Osawa | 257/339 |
| 6,573,558 B2 | * | 6/2003 | Disney | 257/328 |
| 6,649,975 B2 | * | 11/2003 | Baliga | 257/330 |
| 2003/0006453 A1 | * | 1/2003 | Liang et al. | 257/328 |

FOREIGN PATENT DOCUMENTS

EP          0053854        11/1981

OTHER PUBLICATIONS

Y. Baba, N. Matsuda, S. Hiraki, and S. Yasuda, "A Study on a High Blocking Voltage USMOS–FET With a Double Gate Structure," in Proc. 4th Int. Symp. Power Semiconductor Device and IC's, 1992, pp. 300–302.

B.J. Baliga, T. Syau, and P. Venkatraman, "The Accumulation–Mode Field–Effect Transistor: A New Ultralow On–Resistance MOSFET," IEEE Electron Device Lett, vol. 13, No. 8, pp. 427–429, Aug. 1992.

G. Deboy, M. Marz, J.P. Stengl, H. Strack, J. Tihanyi and H. Weber, "A New Generation of High Voltage MOSFET's Breaks the Limit Line of Silicon," IEDM Tech. Dig. 1998, pp. 683–685.

T. Fuhihara and Y Miyasaka, "Simulated Superior Performances of Semiconductor Superjunction Devices," in Proc. 10th Int. Symp. Power Semiconductor Devices & ICs, 1998, pp. 423–426.

(List continued on next page.)

*Primary Examiner*—Mark V. Prenty
(74) *Attorney, Agent, or Firm*—DInsmore & Shohl LLP

(57) ABSTRACT

A MOSFET includes a dielectric, preferably in the form of a metal thick oxide that extends alongside the MOSFET's drift region. A voltage across this dielectric between its opposing sides exerts an electric field into the drift region to modulate the drift region electric field distribution so as to increase the breakdown voltage of a reverse biased semiconductor junction between the drift region and body region. This allows for higher doping of the drift region, for a given breakdown voltage when compared to conventional MOSFETs.

18 Claims, 19 Drawing Sheets

OTHER PUBLICATIONS

J. Glenn and J. Siekkinen, "A Novel Vertical Deep Trench RESURF DMOS (VTR–DMOS)," in Proc. 12th Int. Symp. Power Semiconductor Device and ICs, 2000, pp. 197–200.

C. Hu, "Optimum Doping Profile For Minimum Ohmic Resistance and High–Breakdown Voltage," IEEE Trans. Electron Devices, vol. ED–26, No. 3, pp 243–244, Mar. 1979.

Y.C. Liang, K.P. Gan, and G.S. Samudra "Oxide–Bypassed VDMOS (OBVDMOS): An Alternative to Superjunction High Voltage MOS Power Devices," IEEE Electron Devices Lett, vol. 22, No. 8, pp. 407–409, Aug. 2001.

T. Minato, T. Nitta, A Uenisi, M. Yaho, M. Harada, and S. Hine, "Which is Cooler, Trench or Multi–Epitaxy?" in Proc. 12th Int. Symp. Power Semiconductor Device and ICs, 2000, pp. 73–76.

T. Nitta, T. Minato, M. Yano, A. Uenisi, M. Harada, and S. Hine, "Experimental Results and Simulation Analysis of 250V Super Trench Power MOSFET (STM),"in Proc. 12th Int. Symp. Power Semiconductor Device and ICs, 2000, pp. 77–80.

P.M. Shenoy, A. Bhalla, and G.M. Dolny, "Analysis of the Effect of Charge Imbalance on the Static and Dynamic Characteristics of the Super Junction MOSFET," in Proc. 11th Int. Symp. Power Semiconductor Device and ICs, 1999, pp. 99–102.

T. Syau, P. Venkatraman, and B.J. Baliga, "Comparison of Ultraflow Specific On–Resistance UMOSFET Structures: The ACCUFET, EXTFET, INVFET, and Conventional UMOSFET's, " IEEE Trans. Electron Devices, vol. 41, No. 5, pp. 800–808, May 1994.

* cited by examiner

POWER MOSFET HAVING ENHANCED BREAKDOWN VOLTAGE

CROSS-REFERENCE TO RELATED APPLICATIONS

This application claims benefits from U.S. Provisional Patent Application No. 60/295,581 filed Jun. 5, 2001, the contents of which are hereby incorporated herein by reference.

FIELD OF THE INVENTION

The present invention relates generally to power semiconductor devices, and more particularly to metal oxide semiconductor field effect transistors (MOSFETs) for high voltage and high current applications.

BACKGROUND OF THE INVENTION

In power electronics applications MOSFETs have become the devices of choice for switching high voltages and currents. When compared to bipolar devices, they have fast switching times and simple gate drive circuitry. Specifically, the double-diffusion MOSFET structure is favoured as it allows easy fabrication and self-alignment of channel length control. In such a MOSFET, current flows between transistor drain and source through a lightly doped drift region and a conduction channel that is electrically formed in the body of the transistor.

Current conduction between drain and source is electrically controlled by a voltage applied to a gate that exerts an electric field on the transistor body to form the channel. The magnitude of the gate voltage varies the channel depth and its conductivity. Application of a gate voltage may thus be used to switch the transistor between its on and off states. In its on state, the resistance from source to drain includes the resistance of the transistor's drift region. In fact, for most power MOSFETs, the drift region resistance is the dominant component of overall on-state resistance, as MOSFETs are majority carrier devices and only limited excess carriers are injected into the drift region to modulate its resistance in the MOSFET's on-state. Of course, high conductivity (and therefore low resistance) of this drift region for high current conduction is extremely desirable. Due to absence of effective modulation mechanism affecting resistance, conductivity of the drift region is mainly dependent on, and proportional to, the background doping concentration of this region.

In the MOSFET's off-state, the body region to drift region junction prevents conduction of current, provided that the potential difference across this junction does not exceed the avalanche or punch-through breakdown voltage of the junction. Almost the entire potential drop is in the drift region at drain side of this junction. The potential drop across the body region and the source region is significantly smaller than that of the drift region due to the much higher doping concentration of the body and source regions. The electric field profile in the drift region has its maximum amplitude at the junction and decreases linearly when moving away from the junction, eventually to zero. How quickly the field drops when moving away from the junction is strongly influenced by the drift region's background doping concentration. The total integrated area under the field distribution is equal to the voltage across the junction. A higher doping concentration will make the field drop more quickly, creating a higher peak junction field for the same amount of the voltage applied compared to a lower doping region.

Thus a higher doping in the drift region not only makes the on-state resistance lower but also decreases the off-state breakdown voltage of the body region to drift region junction. In conventional double diffused silicon MOSFETs, there exists a trade-off limit between the specific on-state resistance, $R_{on,sp}$ and the off-state breakdown voltage, $BV_{dss}$, i.e. $R_{on,sp} \propto BV_{dss}^{2.5}$, as for example described in C. Hu, "Optimum doping profile for minimum ohmic resistance and high breakdown voltage", *IEEE Transactions on Electron Devices*, Vol. ED-26(3), pp. 243–245, 1979. As such, power MOSFET designers are constantly seeking ways to lower drift region resistance without reducing the body region to drift region junction breakdown voltage.

Recently, proposed MOSFET designs alternately stack p and n layers to overcome the silicon trade-off limit, as for example illustrated in U.S. Pat. Nos. 5,216,275, 5,438,215 and European Patent EP0053854. These disclosed devices all rely on the charge compensation principle of the alternating p and n layers to increase the permissible doping of the device so that the relationship between on-state resistance and off-state breakdown voltage can be improved.

Another approach disclosed in U.S. Pat. No. 5,637,898 proposes a linearly graded doping profile to modulate the field distribution in the drift region. The width of the drift region is limited as the linear profile is achieved by the angled implantation from trenched sidewalls.

All of these proposed MOSFETS are, however, difficult to fabricate, involving expensive multi-epitaxy process, as for example detailed in G. Deboy, M. Marz, J.-P. Stengl, H. Strack, J. Tihanyi and H. Weber, "A new generation of high voltage MOSFETs breaks the limit line of silicon", *IEEE IEDM Technical Digest*, pp. 683–685, 1998.

Subsequent developments have been aimed at achieving the charge compensation by other processes as for example detailed in T. Nitta, T. Minato, M. Yano, A. Uenisi, M. Harada and S. Hine, "Experimental Results and Simulation Analysis of 250V Super trench Power MOSFET (STM)", *Proc. 12th Int. Symp. Power Semiconductor Device and ICs*, pp. 77–80, 2000, T. Minato, T. Nitta, A. Uenisi, M. Yano, M. Harada and S. Hine, "Which is cooler, trench or Multi-Epitaxy?", *Proc. 12th International Symposium on Power Semiconductor Device and ICs*, pp. 73–76, 2000, and in J. Glenn and J. Siekkinen, "A VDMOS vertical deep trench RESURF DMOS (VTR-DMOS)", *Procedure 12th International Symposium on Power Semiconductor Device and ICs*, pp. 197–200, 2000. These newer processes are generally limited by the narrow window imposed by the precise charge balance needed to achieve the optimum on-resistance and the p/n layer inter-diffusion, as for example explained in P. M. Shenoy, A. Bhalla and G. M. Dolny, "Analysis of the effect of charge imbalance on the static and dynamic characteristics of the super junction MOSFET", *Proc. 11th International Symposium on Power Semiconductor Device and ICs*, pp. 99–102, 1999.

Accordingly, there is need for an improved power MOSFET, having an improved breakdown voltage to on-state resistance relationship.

SUMMARY OF THE INVENTION

The present invention proposes a new approach to increasing MOSFET breakdown voltage, which is easier to realise and thus yields a better control than existing MOSFET designs. In accordance with an aspect of the present invention, a MOSFET includes a dielectric, preferably in the form of a metal thick oxide, that extends alongside the MOSFET's drift region. A voltage across this dielectric between its opposing sides exerts an electric field into the drift region to increase the breakdown voltage of a reverse biased semiconductor junction between the drift region and body region. This allows for higher doping of the drift region, for a given breakdown voltage when compared to conventional MOSFETs.

In accordance with a first aspect of the present invention, a power MOSFET includes a source region; a drain region; a gate; a body region; and a drift region extending between the body region and drain region, to at least partially guide current from the drain region to the source region and a dielectric having opposing sides. One of these opposing sides extending alongside the drift region, and an opposite one of its opposing sides connected to a conducting region, so that a voltage across the dielectric between its opposing sides exerts an electric field into the drift region to redistribute free carriers in the drift region and thereby affect the electrical field distribution in the drift region to increase the breakdown voltage of a reverse biased semiconductor junction between the drift region and the body region.

In accordance with another aspect of the invention, a method of forming a metal oxide semiconductor transistor (MOSFET) in a semiconductor wafer includes, forming opposed vertically extending trenches in the semiconductor wafer; covering interior walls of each of the trenches with a dielectric material of a defined thickness; filling a volume of each of the trenches between the dielectric material with a conductive material; forming a double diffused MOSFET structure between the opposed vertical trenches, the MOSFET structure formed to have a drift region that abuts the dielectric material along at least a portion of its vertical extent.

Conveniently, this allows a lower specific on-state resistance, $R_{on,\,sp}$ at a given drain to source voltage $BV_{dss}$ than dictated by the conventional limit, without using expensive and complicated process technology.

Precise charge compensation is not required. Instead it is the oxide thickness that is controlled for optimal performance.

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures which illustrate by way of example only, embodiments of the present invention.

DETAILED DESCRIPTION

Figure 1:
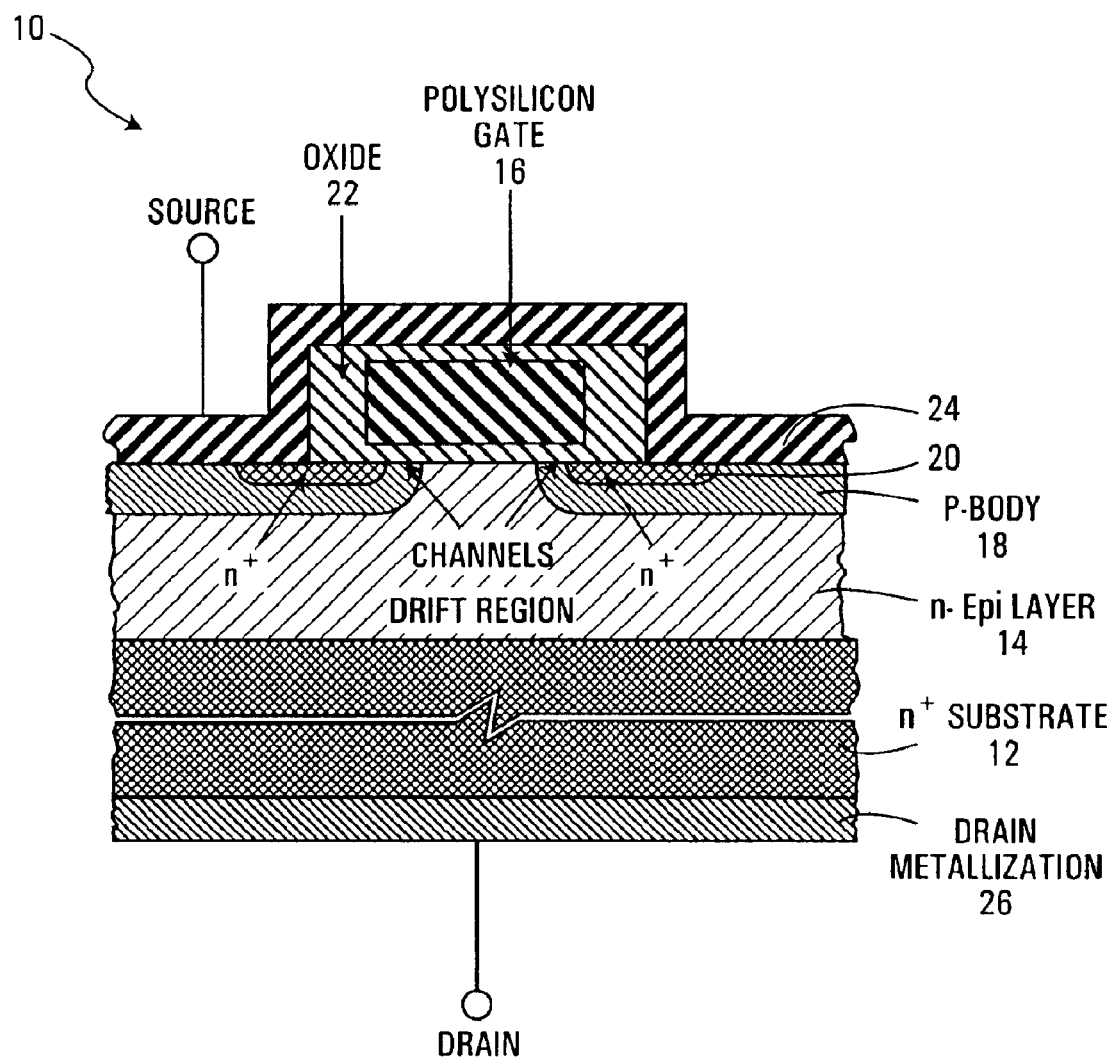
FIG. 1 illustrates a conventional planar gate MOSFET.

FIG. 1 illustrates a conventional planar gate, n-channel power MOSFET 10. MOSFET 10 is formed on a heavily doped n+ semiconductor substrate 12. A more lightly doped epitaxial layer, defining a drift region 14, is grown on substrate 12. At the top of the epitaxial layer, p type body regions 18 are formed. n+ source regions 20 are formed within body regions 18. A gate 16 is formed atop region 14 and overlaps p-type body regions 18. Gate 16 is insulated from drift region 14 and p-type body regions 18 by an oxide layer 22. Gate 16 is preferably formed from a heavily doped poly-silicon. Metal contacts 24 and 26 are formed for electrical interconnection of source regions 20 and substrate 12 to allow these to act as source and drain contacts, respectively.

As is understood, current may flow between drain and source in the presence of an n channel between the source region and n drift region 14. An applied voltage at gate 16 exerts a field creating a thin inversion mobile charge zone underneath the gate oxide layer 22 in p-type body regions 18, defining the conducting n channel from source region 20 into drift region 14. The resistance from source contact 24 to drain contact 26 is in large part attributable to the resistance of the drift region 14. The resistance of the drift region 14, in turn, is inversely proportional to the available free carriers and therefore the concentration of dopants $N_d$ in the drift region 14.

In the absence of a voltage at gate 16 MOSFET 10 is in its off-state, and the p-n junction between the p body region 18 and the n drift region 14 is reverse biased. Below a breakdown voltage this junction sustains the drain to source voltage and, except for a small leakage current, prevents the flow of current from drain to source. As will be appreciated, breakdown of this junction occurs if the electric field at the junction exceeds a defined avalanche value, $E_0$. For silicon $E_0 = 8 \times 10^5$ V/cm, at room temperature.

For the described pn junction, the breakdown voltage, $V_{br}$ may be expressed in terms of the electric field avalanche value, $E_0$, and n doping, $N_d$ as $$V_{br}^{4/3} = (\epsilon_{si} E_0^2)/(2\, q\, N_d) \tag{1}$$

where $\epsilon_{si}$ is the dielectric constant of the silicon material and q is the electron charge. Clearly, while conductivity is proportional to the background doping of the drift region 14, the breakdown voltage of the body region to drift region junction is inversely proportional to the same doping level.

Figure 2A:
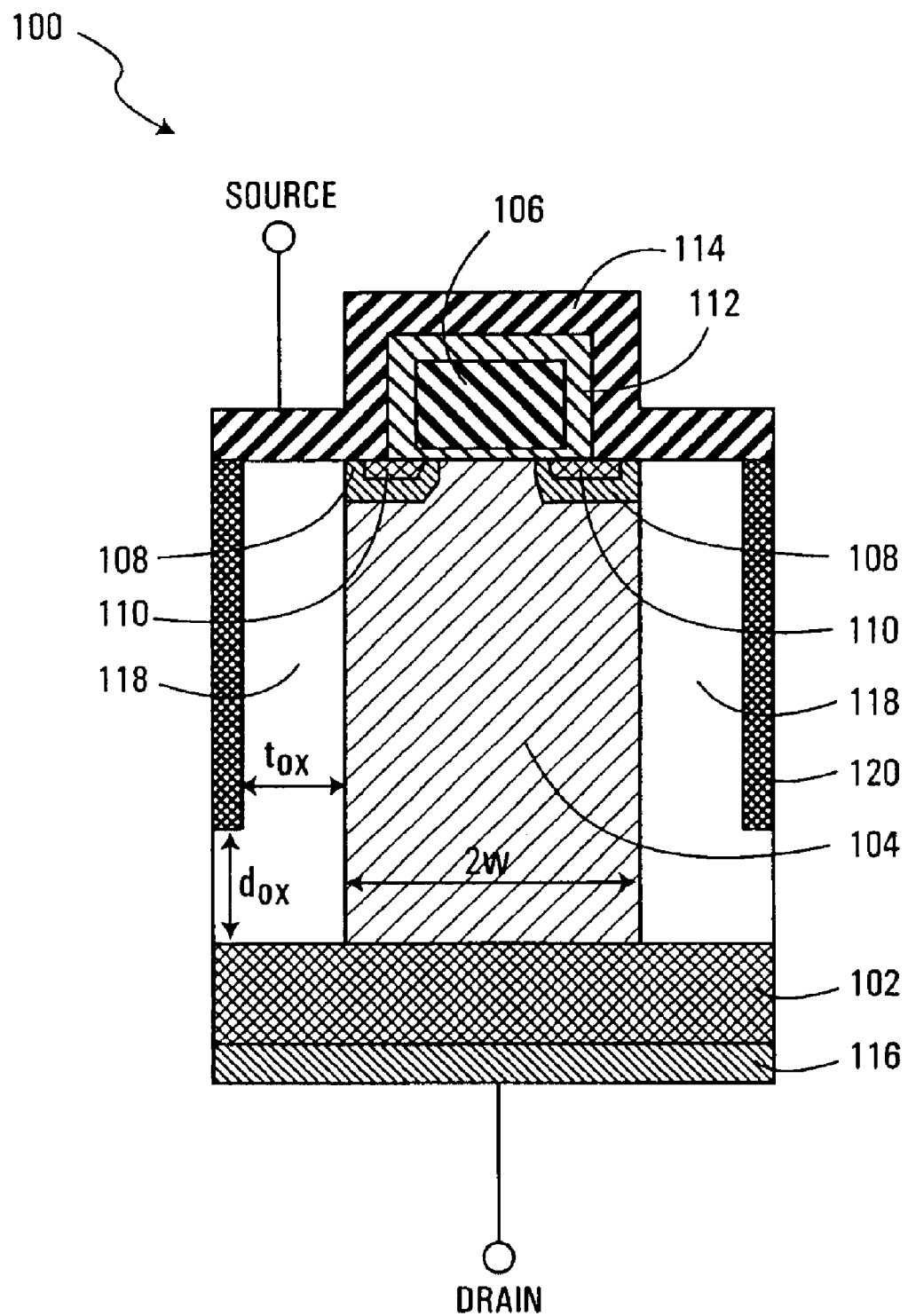
FIG. 2A illustrates a planar gate MOSFET, exemplary of an embodiment of the present invention.

FIG. 2A illustrates a MOSFET 100, exemplary of an embodiment of the present invention. Like a conventional MOSFET 10 (FIG. 1) MOSFET 100 is formed on a heavily doped n+ semiconductor substrate 102. A more lightly doped epitaxial layer defining drift region 104 is grown on substrate 102. At the top of region 104, p-type body regions 108 are formed. n+ source regions 110 are formed within body regions 108. A gate 106 is formed atop the epitaxial layer across the p-body regions to reach source regions 110, and is insulated therefrom by an oxide layer 112. Metal contacts 114 and 116 are formed for electrical interconnection source regions 110 and substrate 102 to act as source and drain contacts, respectively.

Additionally, MOSFET 100 includes sidewall metal-thick-oxide (MTO) dielectric columns 118. Each of dielectric columns 118 extends vertically at the opposite edges of n drift region 104. As such, drift region 104 resembles a column having width 2w. One edge of each dielectric column 118 is adjacent to n drift region 104 of MOSFET 100. The opposite edge of each column 118 is bounded by a vertically extending conductive region 120. Preferably each conductive region 120 is formed of a p+/n+ poly-silicon semiconductor. As well, conductive regions 120 are electrically connected to source metal contact 114.

Figure 2B:
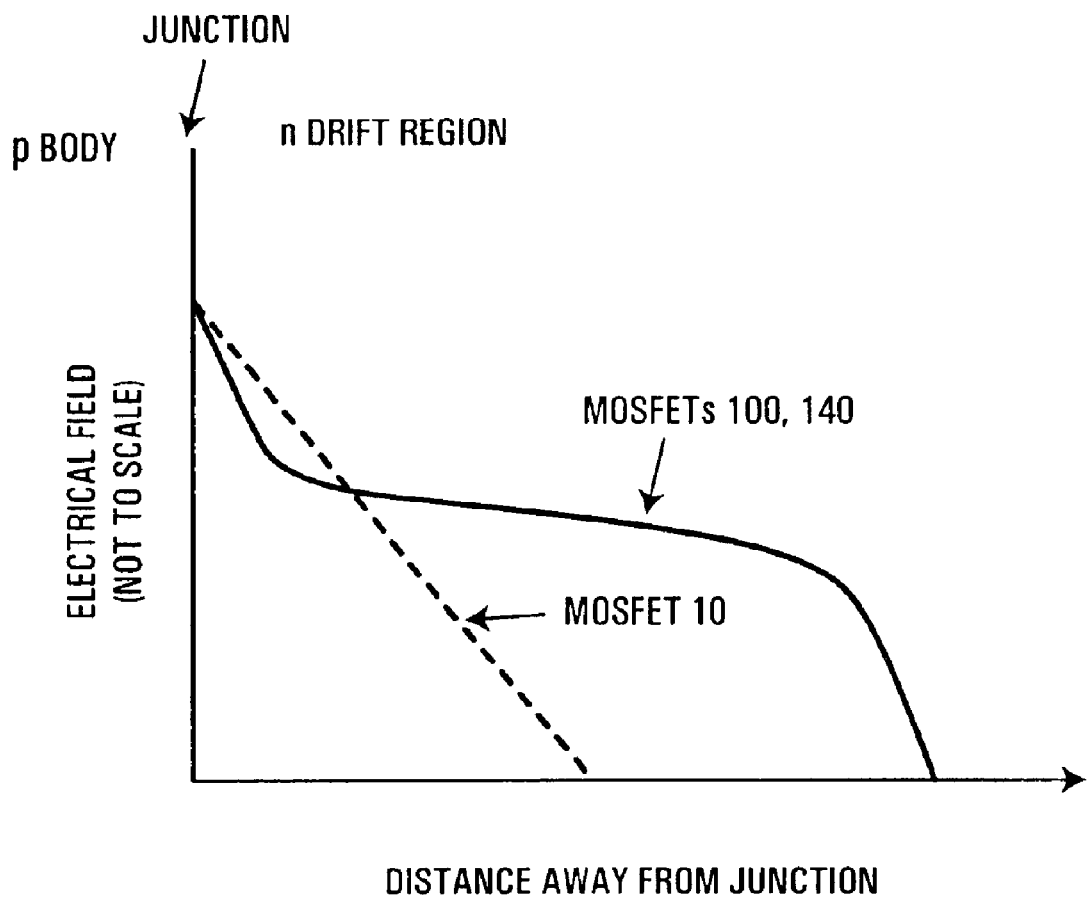
FIG. 2B illustrates an electric field distribution for the MOSFETs of FIGS. 1 and 2A.

FIG. 2B illustrates the electric field distribution as a function of distance from the body region to drift region junction for MOSFET 100 and MOSFET 10 in their off-state. Functionally, for MOSFET 100 in its off-state, the voltage across each column 118 deposits a charge at the edge of each column 118. This charge, in turn, exerts an electric field on drift region 104 that depletes free carriers in the n column of the drift region 104 laterally. That is, free carriers are redistributed within drift region 104. This alters the original vertical field distribution within the drift region 104 to have a shape as illustrated in FIG. 2B. That is, the vertical field magnitude is no longer a linear triangle-like distribution like that in MOSFET 10, but a square-like distribution as shown. As noted, the voltage across the junction equals the integral of the field distribution. As such, for the same voltage the peak magnitude of the field across the junction of MOSFET 100 will be less than the peak magnitude of the field across the junction of MOSFET 10.

Preferably, the sidewall oxide is thermally grown to obtain the highest breakdown quality, or if any other dielectric material is chosen to replace the oxide, it should have a breakdown field strength equal to or greater than that of the thermal oxide. The dielectric thickness needs to be properly controlled as described below.

Quantitatively, the voltage drop across column 118 (i.e. the lateral voltage drop) can be approximated as, $$V \approx (Q\ t_{ox})/(\epsilon_{ox}\ A) = (q\ N_d\ w\ t_{ox})/\epsilon_{ox} \qquad (2)$$

where, Q is the charge at the surface of the column 118, $t_{ox}$ is the oxide thickness, $\epsilon_{ox}$ is the oxide dielectric constant, A is the sidewall area, and q is the electron charge. Q at the surface of column 118, in turn, depletes free carriers from the n drift region 104.

Ideally, in order to have an optimal effect on the breakdown voltage in the body, the charge at the surface of column 118 should deplete the entire n-drift region just before breakdown, thus solving equations (1) and (2), yields $$N_d \approx [(\epsilon_{si}\ E_0^2 \cdot \epsilon_{ox}^{4/3})/(2 \cdot q^{7/3})]^{3/7} \cdot [t_{ox} \cdot w]^{-4/7} = 2.90 \times 10^{11} \cdot [t_{ox} \cdot w]^{-4/7} \qquad (3)$$

Equation (3) defines the mathematical relationship among doping concentration of the drift region 104, the sidewall oxide thickness of column 118 and the half width (w) of the drift region 104 to function at its preferred breakdown voltage.

MOSFET 100 will have a desired optimal breakdown voltage for a particular $N_d$ as long as any combination of the three design parameters, $N_d$, $t_{ox}$ and w satisfy equation (3).

The specific on-state resistance between drain and source $R_{on,sp}$ is calculated to be proportion to $(w+w_{MTO})/(N_d \times w)$ where the trench column half-width, $w_{MTO}$ is the sum of sidewall oxide thickness and the electrode half-width, $w_{elec}$, that is, $w_{MTO} = t_{ox} + w_{elec}$. It may be shown that an optimal ratio of $w_{MTO}$ to w of 4:3 exists for minimum $R_{on,sp}$. The thickness of the bottom oxide $d_{ox}$ can be chosen to be the same as or preferably greater than $t_{ox}$.

Owing to this additional field modulation by lateral depletion, the doping in the drift region 104 can be raised to a value much higher than that permissible in conventional MOSFETs such as MOSFET 10, thus improving the specific on-resistance to breakdown voltage relationship curve for silicon MOSFET 100. In contrast to known ways of increasing breakdown voltage as for example, suggested in noted U.S. Pat. Nos. 5,216,275, and 5,438,215, no precise matching of doping is needed in MOSFET 100. Instead, for a particular drift region width 2w and doping $N_d$ (as shown in FIG. 2A), it is primarily the sidewall thickness of each column 118, $t_{ox}$, that needs to be controlled to provide the optimal field effect to deplete the column of the n drift region 104 entirely during the off-state.

Conveniently, as oxide thickness control technology is well-known, MOSFET 100 can be easily and precisely manufactured than known charge compensation structures that require the difficult task of precise doping control and multiple epitaxial growth.

Figure 3:
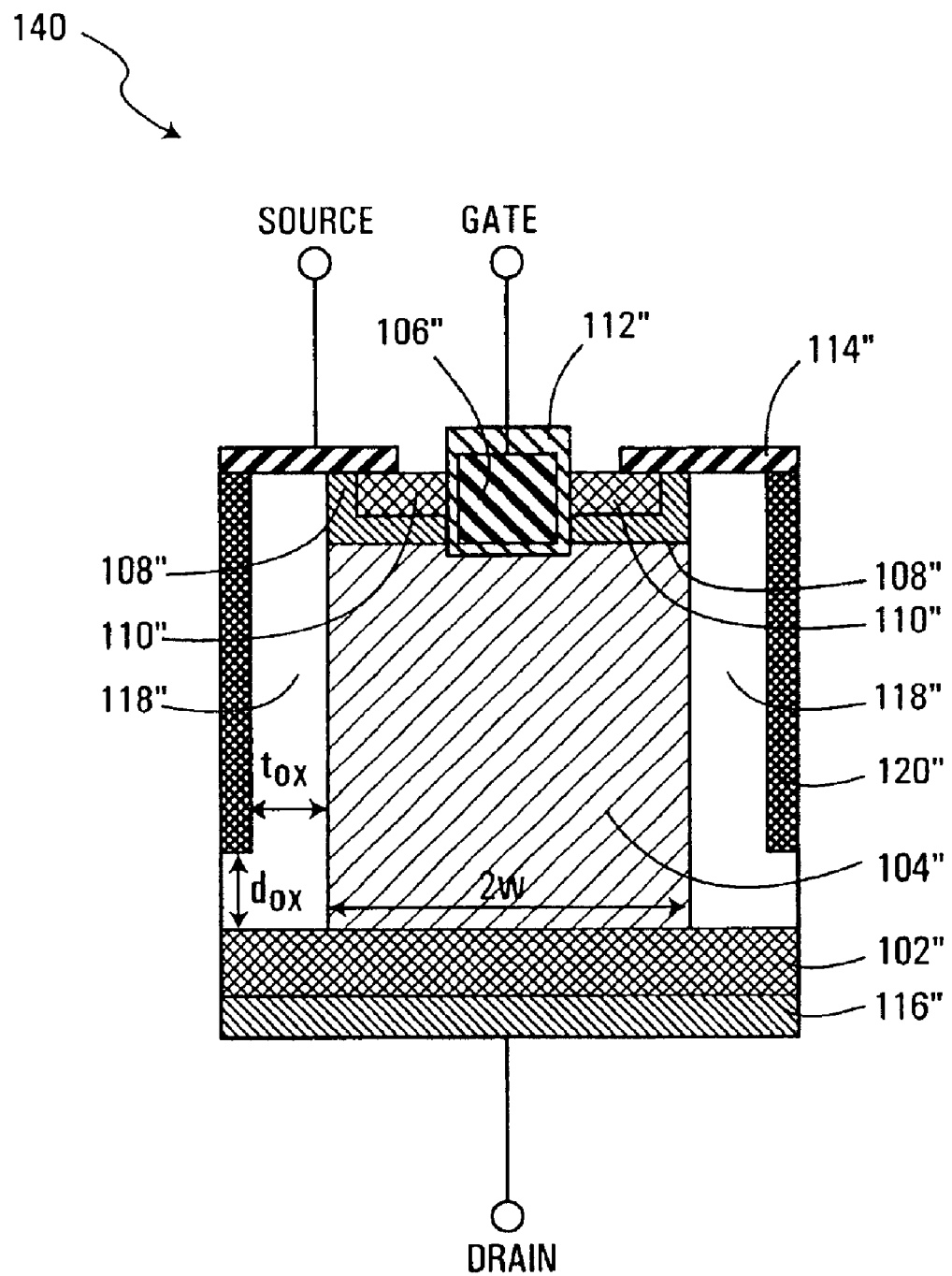
FIG. 3 illustrates a trench gate MOSFET, exemplary of another embodiment of the present invention.

As will be appreciated, MOSFETs exemplary of the present invention may be either planar gate MOSFETs (like MOSFET 100 illustrated in FIG. 2A), or trench gate MOSFETs (like MOSFET 140 illustrated in FIG. 3). Elements of MOSFET 140 are akin to those of MOSFET 100 (FIG. 2) and are therefore labelled with like numerals bearing a double prime (") symbol in FIG. 3.

Figure 4:
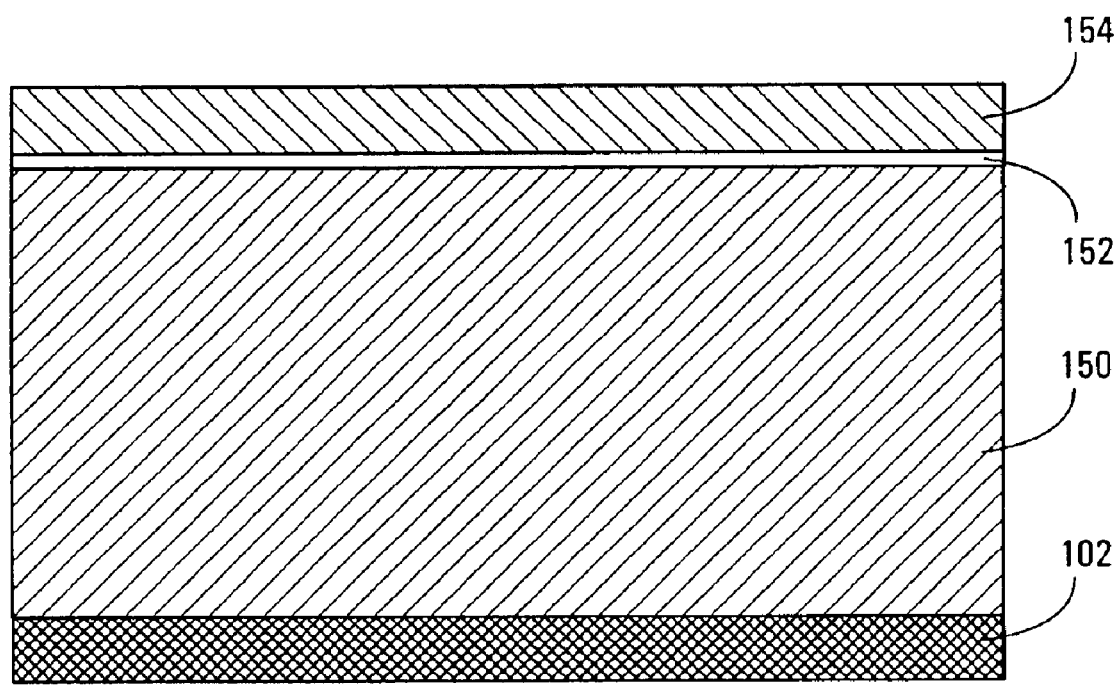
FIGS. 4, 5A–5B, 6A–6B, 7, 8 and 8A–8C illustrate exemplary stages in processes of forming a MOSFET exemplary of an embodiment of the present invention on a semiconductor wafer.

As illustrated in FIG. 4, an epi wafer 150 with suitable Si (100) n-epi thickness and doping $N_d$ is used as starting wafer. Suitable masking materials, for example oxide and nitride layers 152, 154 respectively, are first deposited.

Figure 5A:
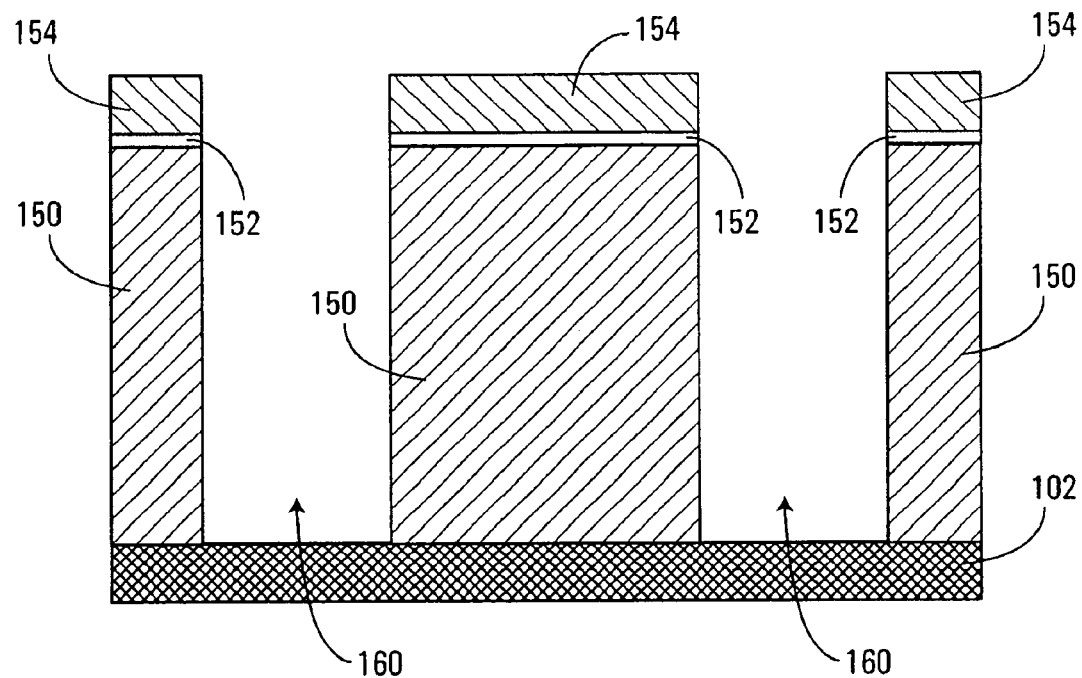
Figure 5B:
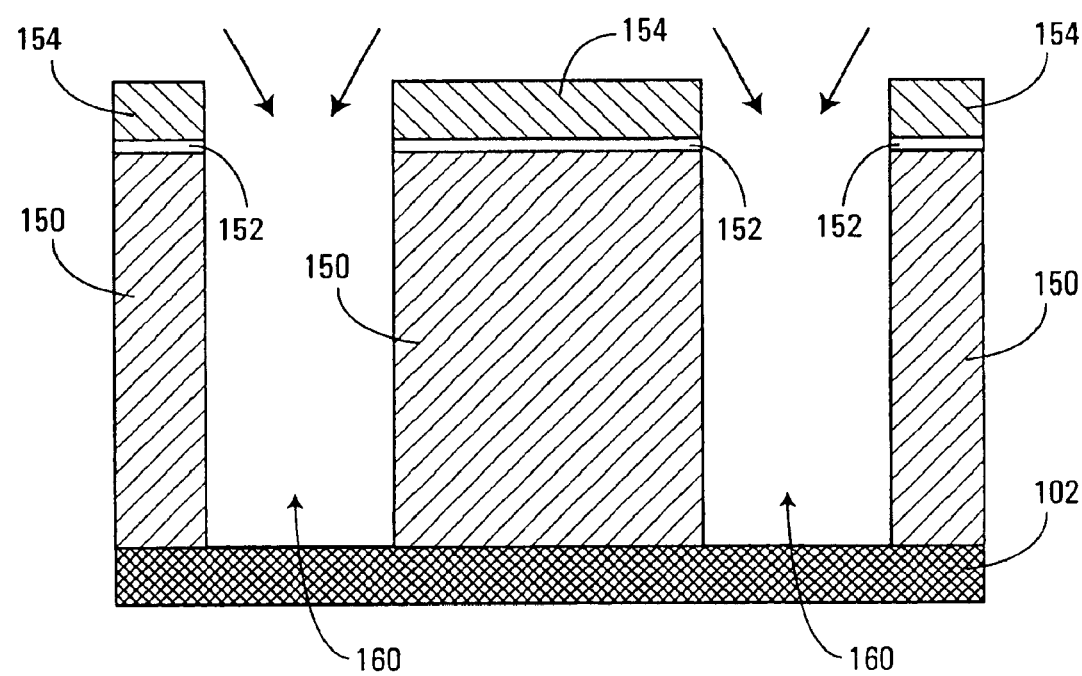

Thereafter, vertically extending trenches 160 to accommodate columns 118 (FIG. 2A) of suitable dimensions are etched on the wafer 150, as illustrated in FIG. 5A. Preferably, trenches 160 are laterally mirrored. The region between trenches 160 defines drift region 104. If the starting wafer is constrained to have different background doping, as for example required by some smart power ICs, then an optional tilted implantation may be performed, as illustrated in FIG. 5B to adjust the background doping in the n drift region column, as required.

Figure 6A:
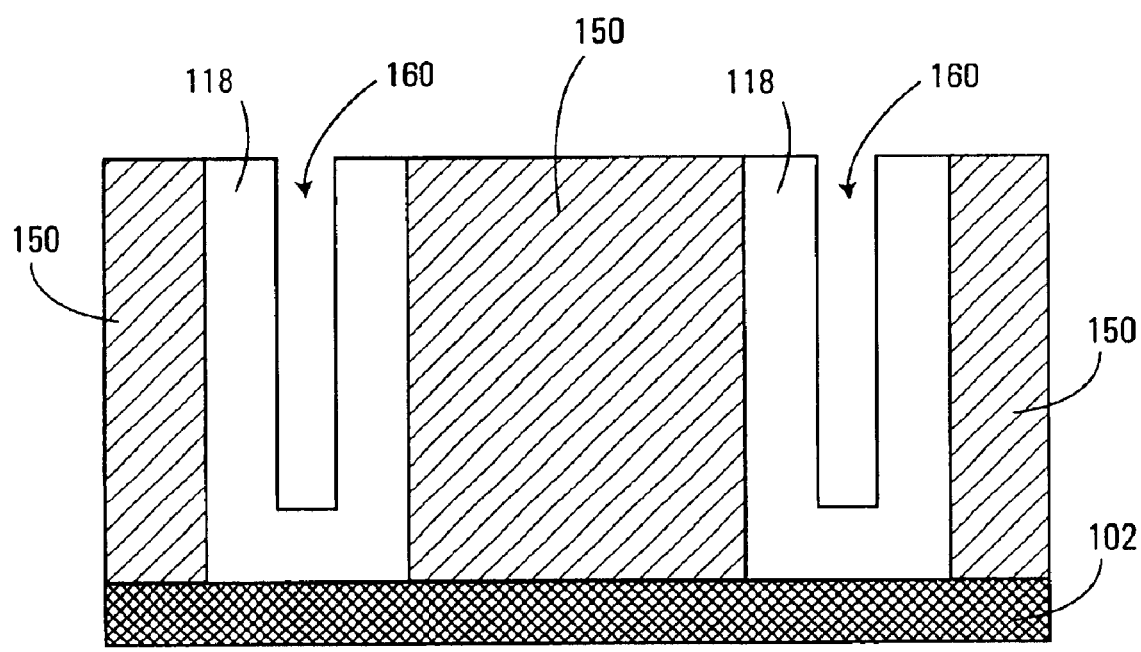
Figure 6B:
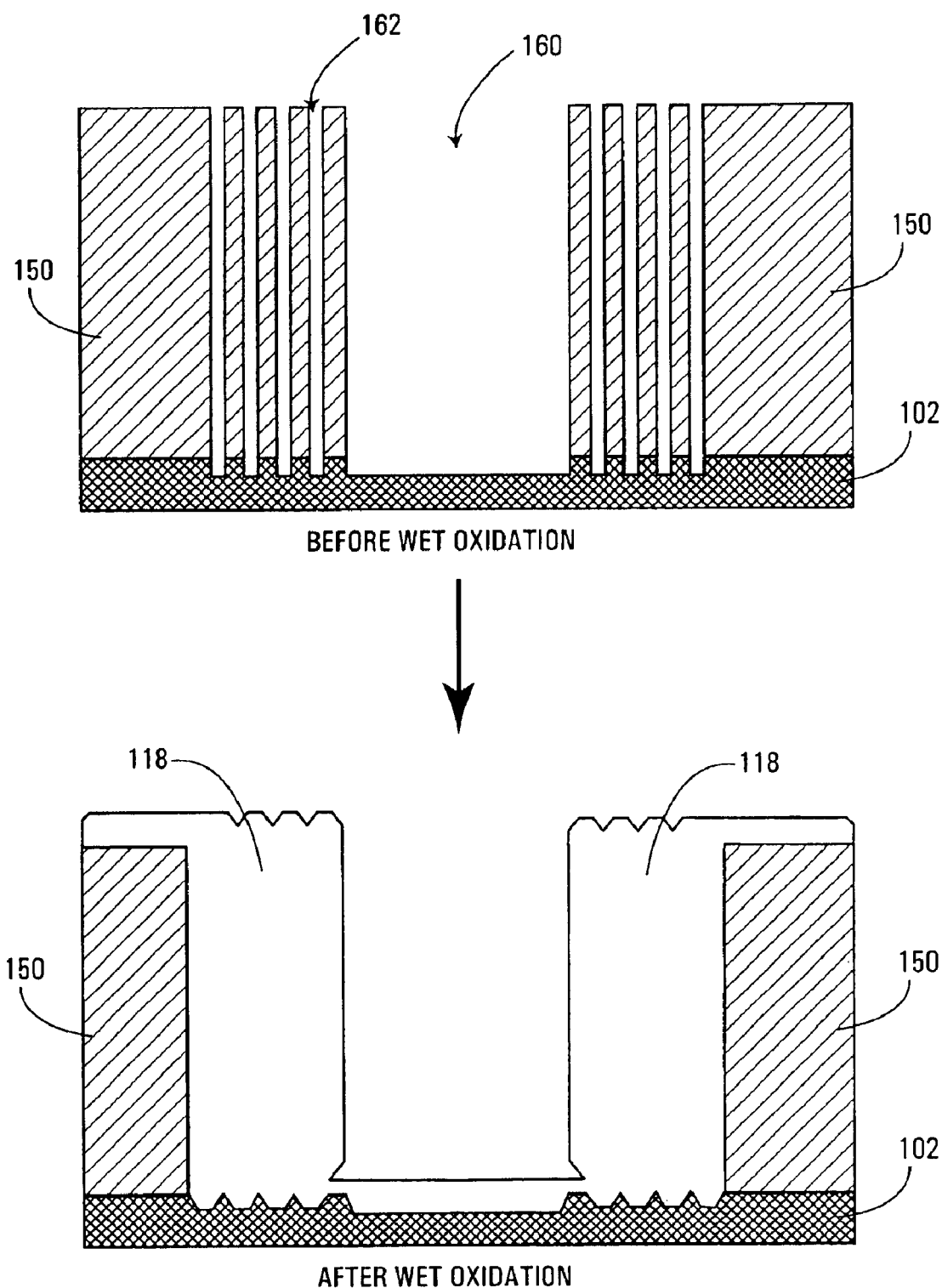
Figure 7:
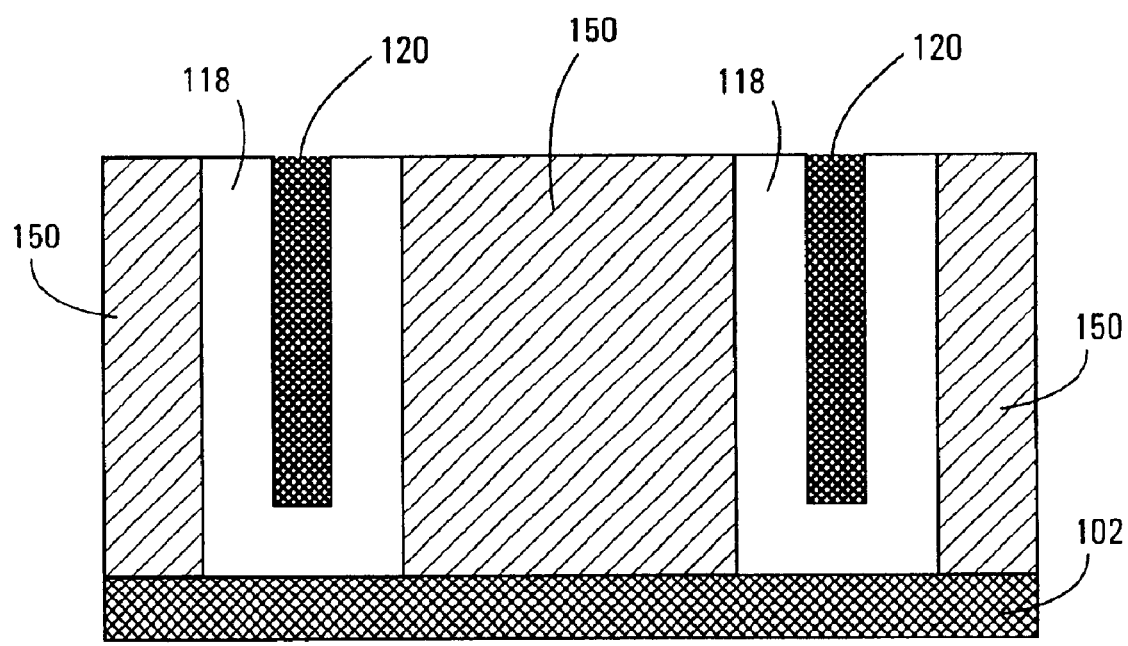
Figure 8:
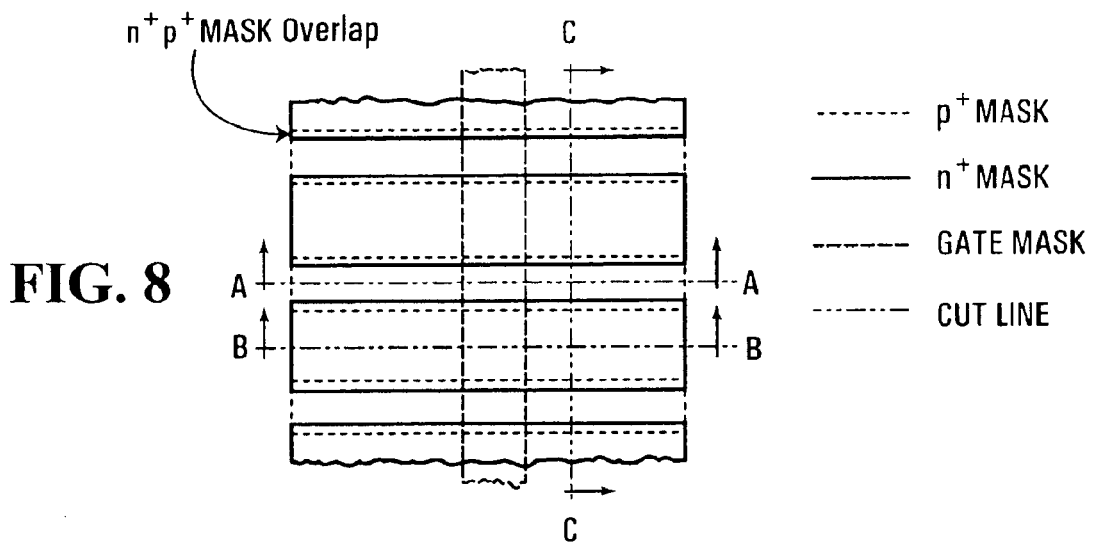
Figure 8A:
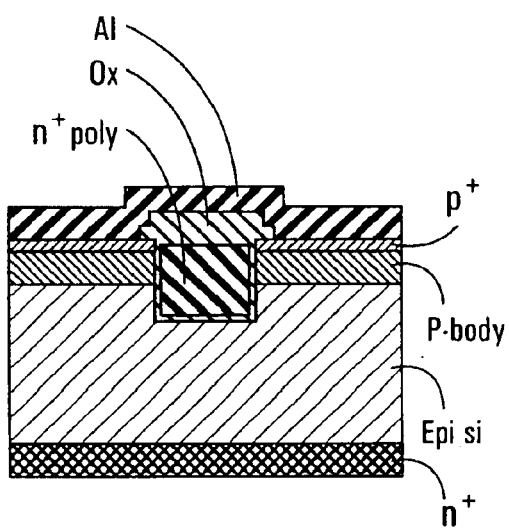
Figure 8B:
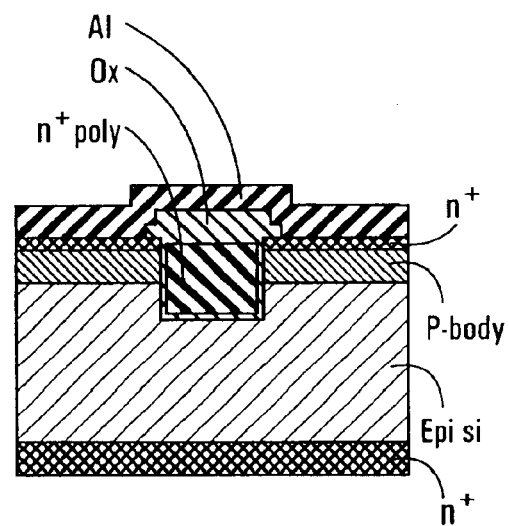
Figure 8C:
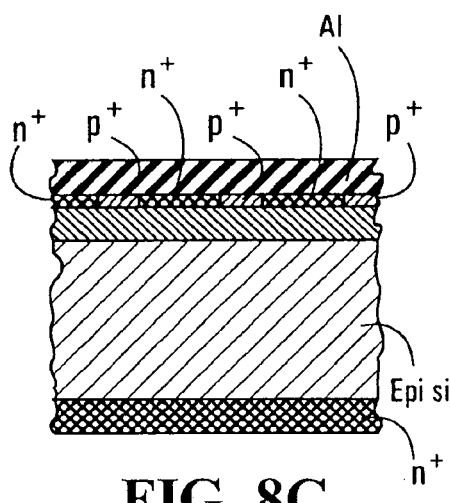

Next, a suitable wet oxidation step giving the required thickness $t_{ox}$ of column 118 is performed and all the masking materials are then stripped, as illustrated in FIG. 6A. This covers the interior sidewalls and floors of trenches 160 with a thick dielectric, like the suggested oxide. Alternatively, if direct wet oxidation cannot get the required dielectric thickness, multiple thin trenches 162 and the subsequent silicon column consumption, as illustrated in FIG. 6B may be employed to obtain a thicker side-wall thickness Highly doped n+ or p+ poly-silicon deposition (for example POCl$_3$ doping) is used to fill up the remainder of trenches 160 as illustrated in FIG. 7. This poly-silicon provides the contact region 120 to source metal for columns 118. The poly-silicon etch-back step is performed to remove any excess poly-silicon on the top surface. Thereafter, the conventional power MOSFET is formed between the trenches using conventional process steps, giving the final MOSFET device structure as shown in FIG. 2A (planar gate) or FIG. 3 (trench gate).

Conveniently, each trench 160 may accommodate two columns 118, each of which may form part of one of two adjacent transistors formed on wafer 150.

Optionally, in order to reduce the n drift region 104 column width for larger $N_d$, the body contact p+ region, usually located laterally next to the n+ source region, can be moved vertically (i.e. upward but still next to the n+ source region). The resulting segmented source will have a smaller width. The layout view for this segmented source design is shown in FIGS. 8, 8A–8C. Note that both planar and trench gate structures can use this segmented source design to reduce the width of drift region 104.

The principles of operation of MOSFETs 100 and 140 (FIGS. 2A and 3) as conjectured above, have been verified by both simulation and experiment. As noted, MOSFETs 100 and 140 will have an improved breakdown voltage for a given doping of drift region, as long as any combination of the three design parameters, $N_d$, $t_{ox}$ and w satisfy equation (3). Numerical analysis confirms the existence of an optimal ratio of column 118 half dielectric trench column width to w of 4:3 for lowest $R_{on, sp}$.

Figure 9:
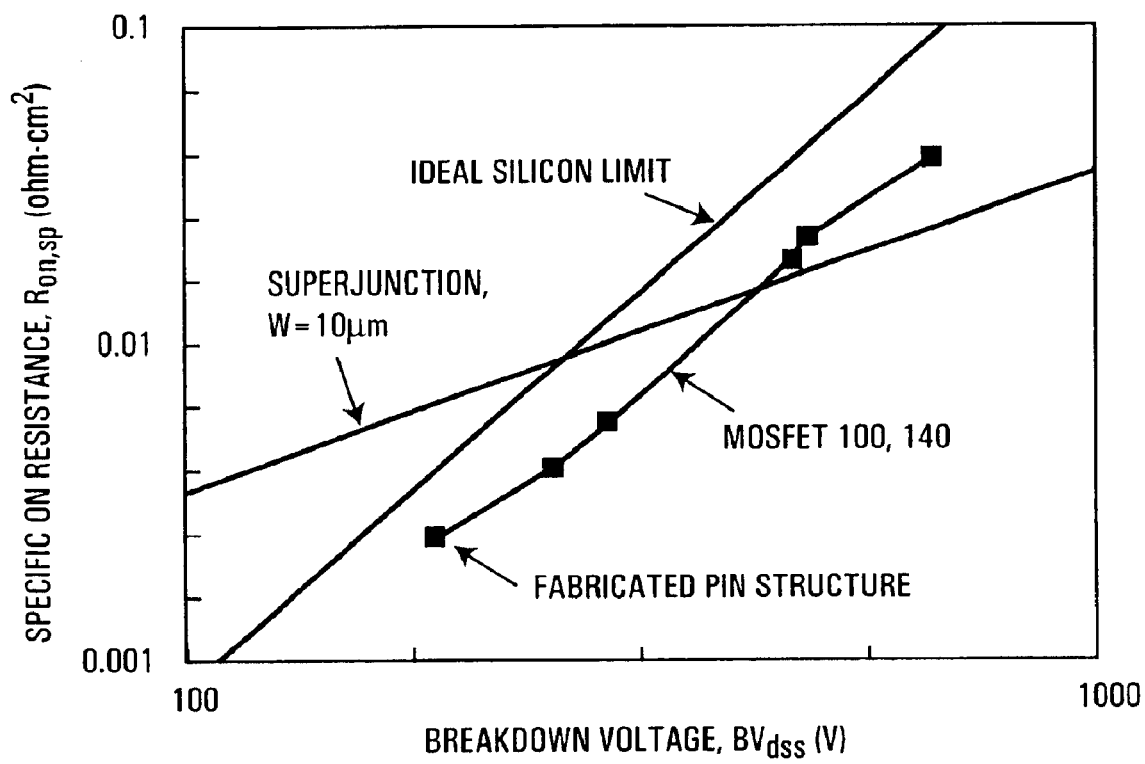
FIG. 9 illustrates the relationship of specific on-state resistance as a function of breakdown voltage for the MOSFET of FIG. 2A.

By following the above conditions, numerical simulations were carried out and the simulation results illustrated in FIG. 9 show that exemplary MOSFETs 100, 140 have improved the specific on-resistance, $R_{on, sp}$ to breakdown voltage, $BV_{dss}$ trade-off curve compared to the conventional case. In fact, the trade-off curve of MOSFETs 100, 140 was found to have a similar dependence as that of the ideal silicon limit but with a smaller coefficient, to yield a lower on-state resistance. This is in contrast to the charge compensation structures, disclosed in U.S. Pat. Nos. 5,216,275 and 5,438,215, where $R_{on, sp}$ varies at different dependences with $BV_{dss}$ with its coefficient dependent on w, the half width of p and n columns. At present, owing to technology constraints and inter-diffusion problems, the width of the drift region in known charge compensation structures cannot be scaled arbitrarily small, especially at high breakdown voltage where a thick epi (for example 50 μm for 600 V) is needed. Thus at present, a practical value of w would be around 10 μm and at this value, MOSFET 100 (or MOSFET 140) has an off-state performance comparable to charge compensation (superjunction) structure at around 500 V device rating. An even better performance can be obtained for voltage rating below 400 V. Note that, the superjunction structure performs worse than the conventional silicon limit at voltage rating below 280 V.

Figure 10:
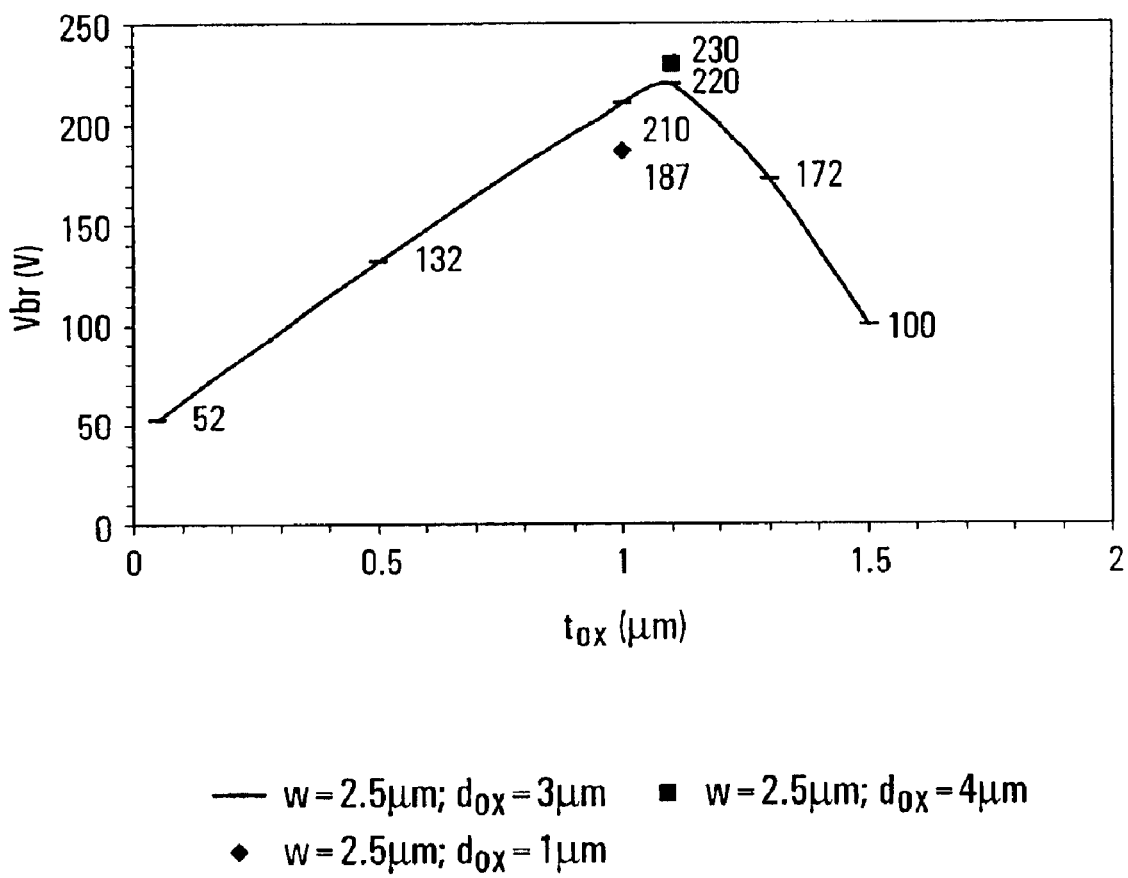
FIG. 10 illustrates the relationship between breakdown voltage and dielectric column width for the MOSFET of FIG. 2A.

As previously noted, column 118 sidewall oxide thickness $t_{ox}$ influences performance of MOSFETs 100, 140. Sensitivity analysis of $t_{ox}$ to $BV_{dss}$ at a nominal value of 1 μm has been performed and the results shown in FIG. 10. As illustrated, $BV_{dss}$ in excess of 200 V was achievable with a $t_{ox}$ tolerance of over ±10% for designs with $d_{ox} > t_{ox}$. Note that a process simplification, resulting in only a minor degraded breakdown performance, can be made by adopting a $d_{ox} = t_{ox}$ design that can be realised in just a single wet oxidation step.

Figure 11:
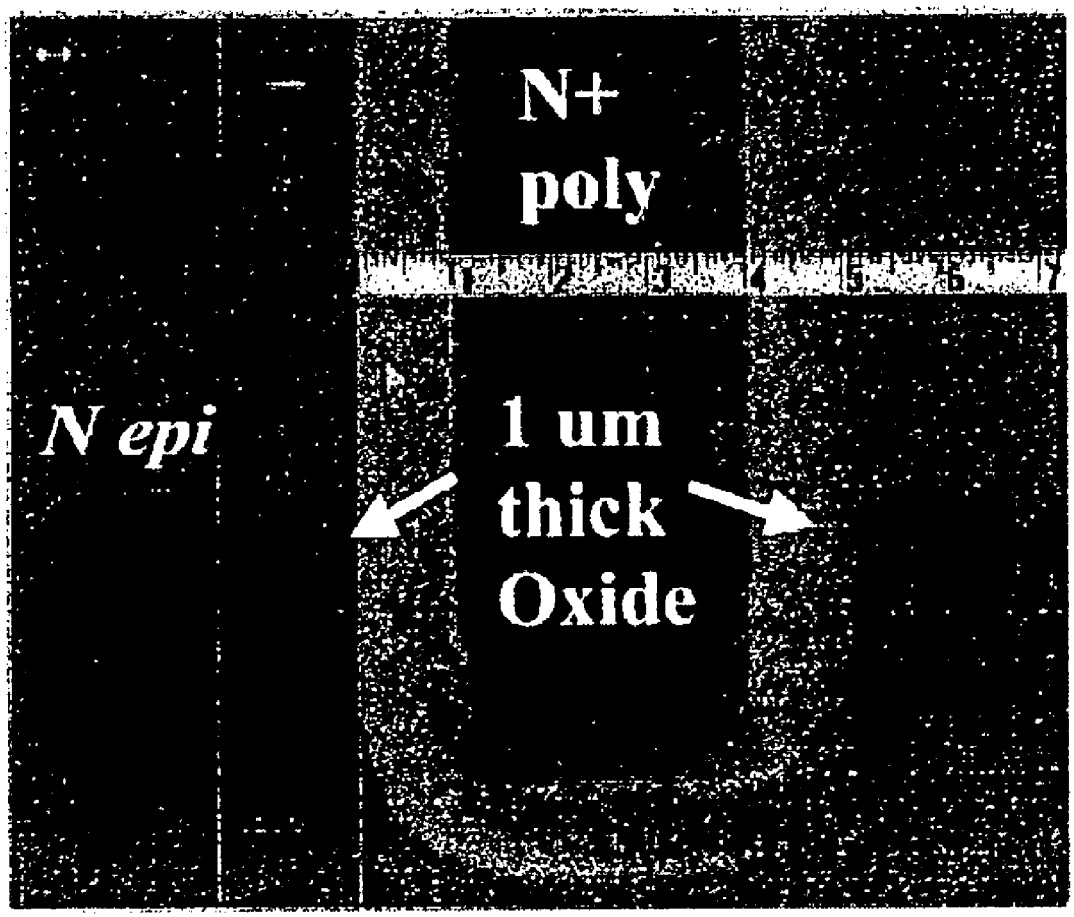
FIG. 11 illustrates a section of p-i-n structure used to approximate performance of the MOSFETs of FIG. 2A and FIG. 3.

Since a MOSFET, like MOSFETs 100, 140, in its off-state is essentially a p-i-n structure, a p-i-n structure with $t_{ox} = d_{ox} = 1$ μm, w=2 μm has been fabricated to verify MOSFETs 100, 140 experimentally. The p-i-n structure was fabricated on a $N_d = 7 \times 10^{15}$ cm$^{-3}$ n-epi starting wafer by following the process flow as detailed above, together with the conventional p-i-n structure without the oxide on the same wafer. Both devices have identical area. Trenches of 4 μm width and 15 μm depth were first etched on the wafer. This was followed by 1 μm wet oxidation step giving a $d_{ox} = t_{ox} = 1$ μm design. Next, polysilicon deposition with POCl$_3$ doping was used to fill up the trenches. After the poly etch-back step, conventional p-i-n diode process steps proceed as usual giving the final device structure as shown in the scanning electron microscopy picture of FIG. 11. It is noteworthy that only one additional mask was needed to complete the whole process compared to conventional case.

Figure 12:
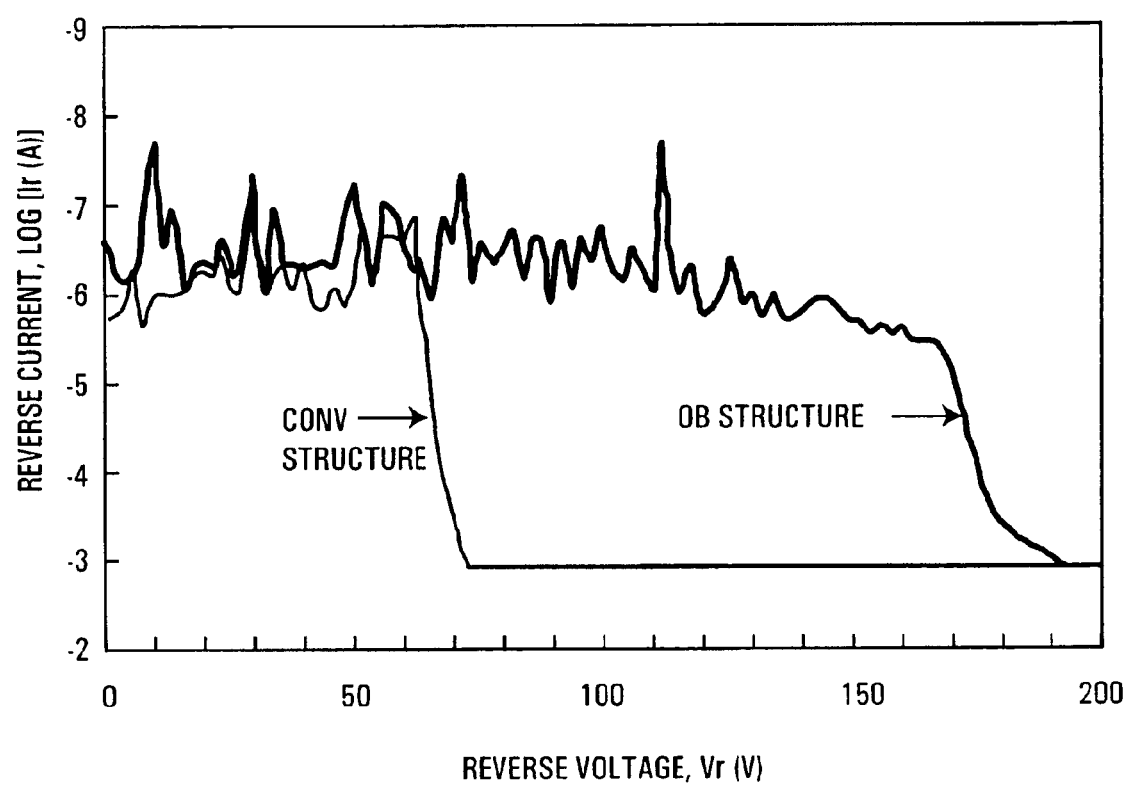
FIG. 12 illustrates measured reverse bias currents of equivalent p-i-n structures for conventional MOSFETs and the MOSFET of FIG. 2A.

FIG. 12 shows a comparison of the measured off-state results of both MOSFETs 100, 140 (as equated by the p-i-n with dielectric oxide column of FIG. 11) and conventional devices. It is clear that the measured breakdown voltage of 170 V for MOSFETs 100, 140 as simulated was more than twice that of conventional device at 67 V. Actually, to achieve 170 V a doping of $2 \times 10^{15}$ cm$^{-3}$ would be required for conventional MOSFETs whereas a doping of $7 \times 10^{15}$ cm$^{-3}$ may be sufficient for MOSFETs 100, 140. A $R_{on, sp}$ reduction of about twice is thus predicted for MOSFET 100 with similar voltage rating after taking into account the reduction in conduction area due to the sidewall oxide. Further improvement in $R_{on, sp}$ is expected if the area occupied by dielectric column in FIG. 11 can be reduced without reducing oxide thickness, by using high aspect ratio trench techniques.

Figure 13:
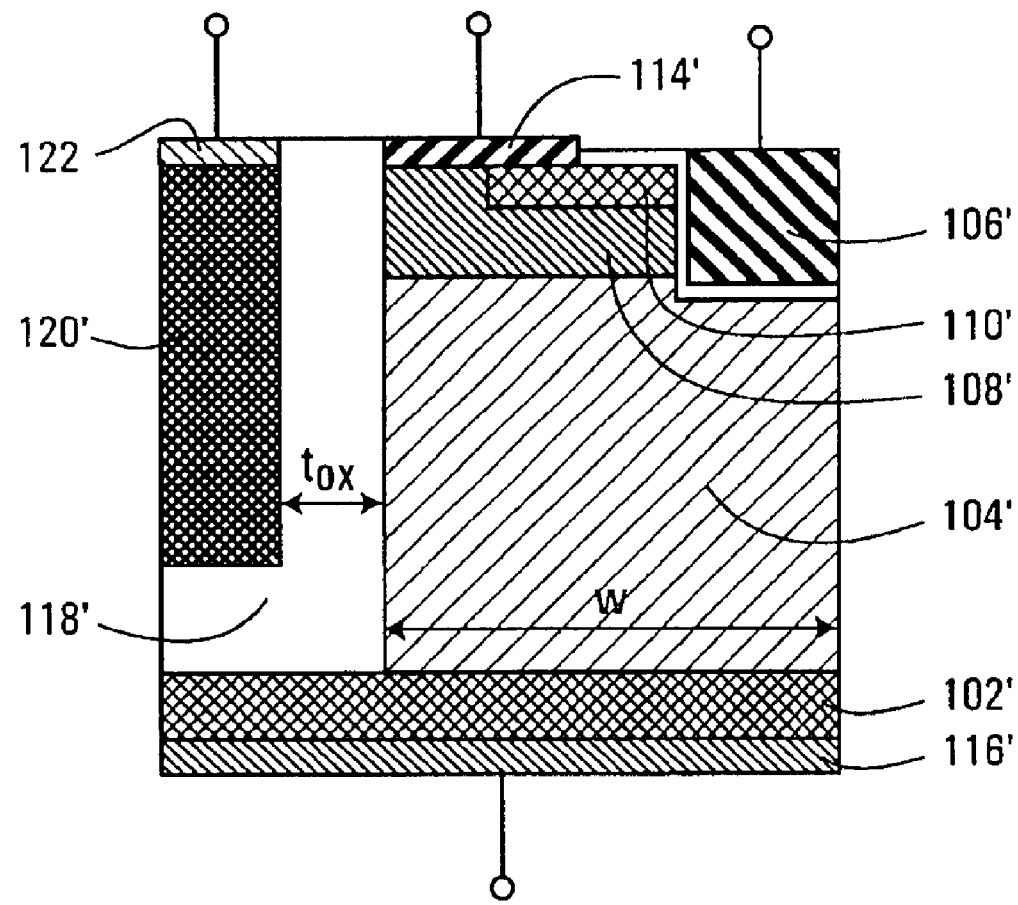
FIG. 13 illustrates a further trench gate MOSFET, exemplary of another embodiment of the present invention.

FIG. 13 illustrates another MOSFET 200, exemplary of a further embodiment of the present invention. As illustrated, MOSFET 200 is a trench gate MOSFET. Components akin to those of MOSFETs 100 and 140 are therefore identified with numerals used to describe MOSFETs 100 and 140, but bearing a prime (') symbol, and are not again explicitly described. In MOSFET 200, however, source contact 114' is not electrically connected with column 118' or conductive region 120'. Instead, conductive region 120' is electrically interconnected to its own contact 122 formed atop conductive region 120'. No contact is interconnected with column 118'. As a result the voltage drop across column 118' may be independently controlled through application of a control voltage to contact 122. Control of the voltage across column 118', in turn, controls the charge and the lateral field at the interface between column 118' and drift region 104'. Blocking voltage may, in turn, be fine-tuned if the voltage falls short of the specification due to process variations after manufacture through application of an appropriate control voltage to contact 122.

Figure 14:
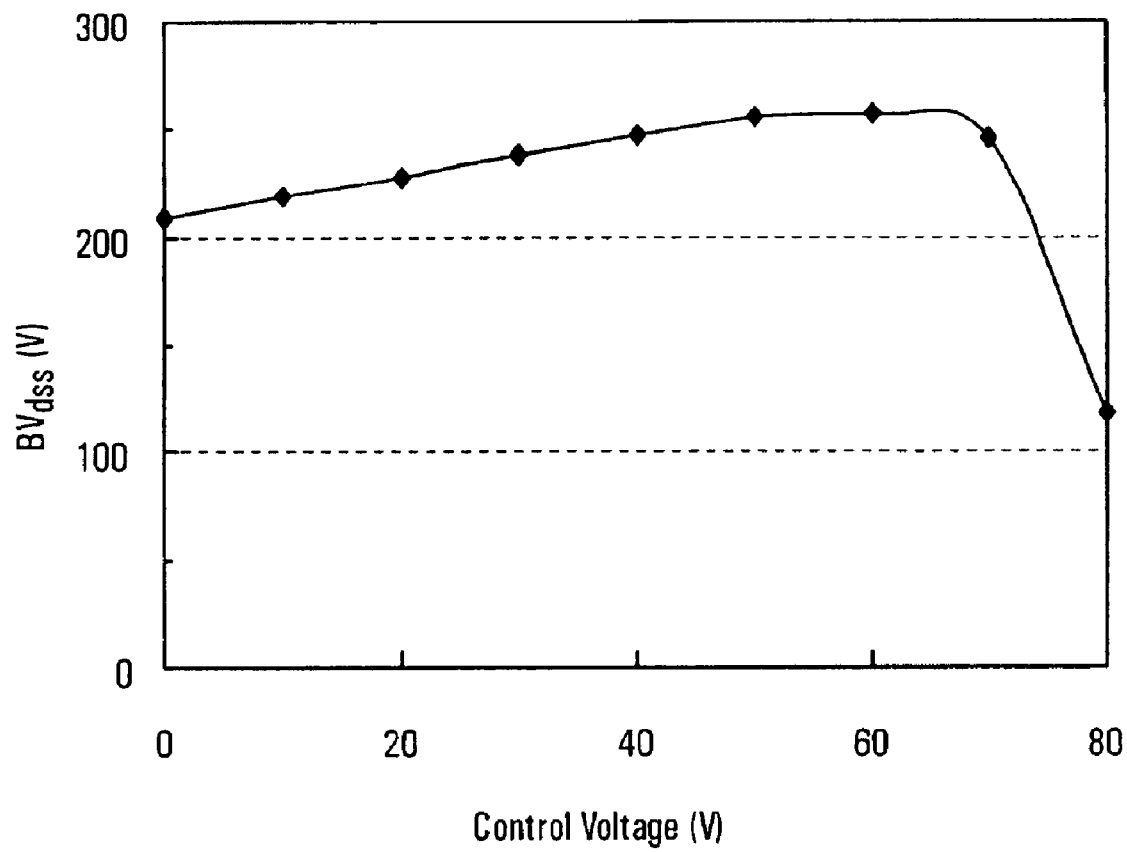
FIG. 14 illustrates the relationship between breakdown voltage and control voltage for the MOSFET of FIG. 13.

FIG. 14, in turn, illustrates the predicted breakdown voltage of example MOSFET 200, determined by numerical simulation, as a function of applied tuning voltage for an example device having $N_d = 3 \times 10^{15}$ cm$^{-3}$; tox=1.5 μm and w=1.5 μm.

At the same time, performance of MOSFET 200 in its on-state may be better than that of MOSFET 140. Specifically, in its on-state, a vertical accumulation layer is formed at the interface between column 118' and N-drift region due to the lateral electric field produced by the positive bias from conductive region 120'. This accumulation layer provides additional path for the current flow in drift region 104', and results in the reduction of on-resistance.

Figure 15:
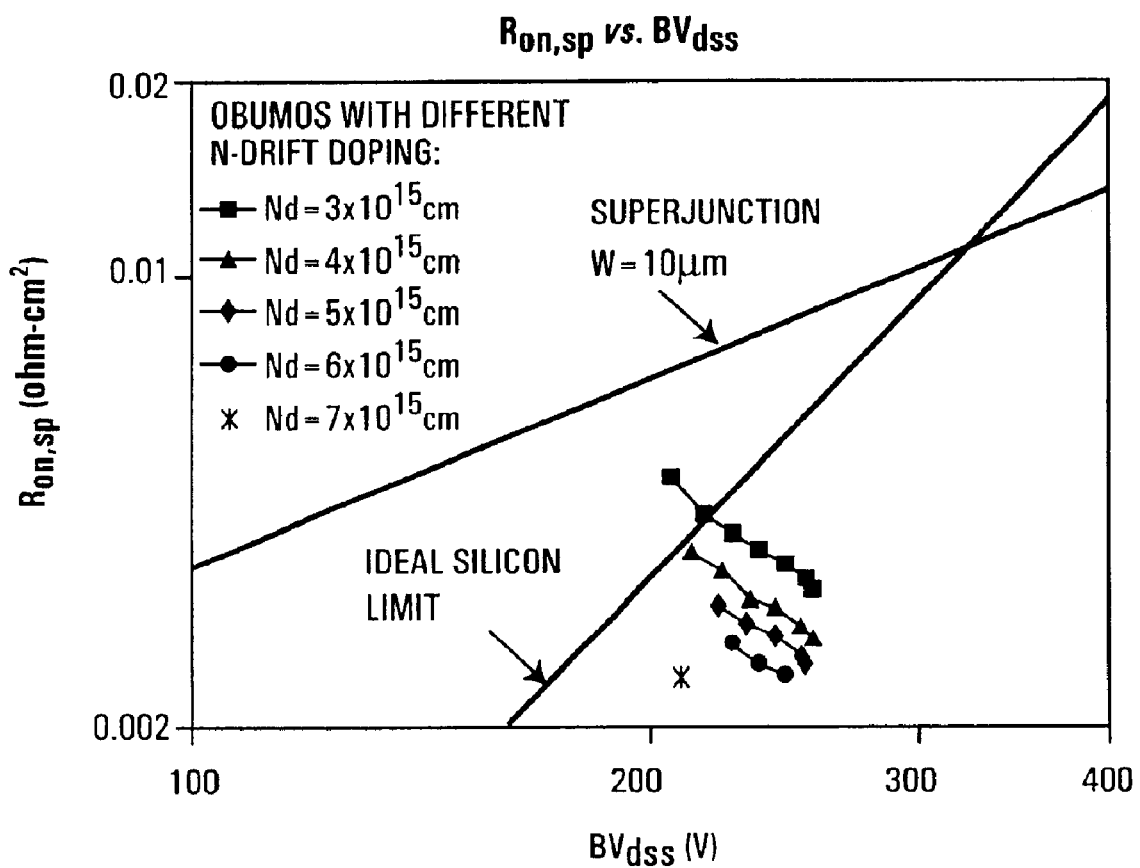
FIG. 15 illustrates specific on-state resistance to breakdown voltage for the MOSFET of FIG. 13.

FIG. 15 illustrates the relationship between $BV_{dss}$ and specific on-resistance ($R_{on,sp}$) of MOSFETs, like example MOSFET 200, at different Nd doping values under different control bias voltages at contact 122, as predicted by numerical simulations. As illustrated, as the control bias voltage is incremented in 10 V increments, from 0V for each example MOSFET, the breakdown voltage and on-state resistance varies. $BV_{dss}$ can be increased by about 48 V and $R_{on,sp}$ can be reduced by about 1.5 mΩ-cm$^2$. As illustrated, the minimum $R_{on,sp}$ obtained under 20V side-poly bias at $N_d = 6 \times 10^{15}$ cm$^{-3}$ is much lower than ideal silicon limit and superjunction devices at a much higher $BV_{dss}$. It also goes further away from ideal silicon limit line compared to the original MOSFETs 100, 140 of FIGS. 2A and 3.

As well, in the saturation region of operation, small signal transconductance gain of a MOSFET like MOSFET 200 is determined by the channel and gate structure and bias. When MOSFET 200 is under a positive control bias, the lateral electric field produced by the external bias acts on the channel and pulls the electrons towards the column 118'. As a result, the inversion layer depth is increased reducing the channel resistance, and the electric field perpendicular to the gate oxide within the channel is diminished giving enhanced channel mobility. This leads to a higher and wider $G_m$ curve.

According to the equation: $F_T = G_m/(2\pi C_{iss})$, where $C_{iss}$ is the sum of gate-source and gate-drain Miller capacitance, the bandwidth $F_T$ will increase correspondingly with the increase of $G_m$ if there is no distinct change in $C_{iss}$. Simulation results show that the improvement of $F_T$ has the same trends as that of $G_m$.

Figure 16:
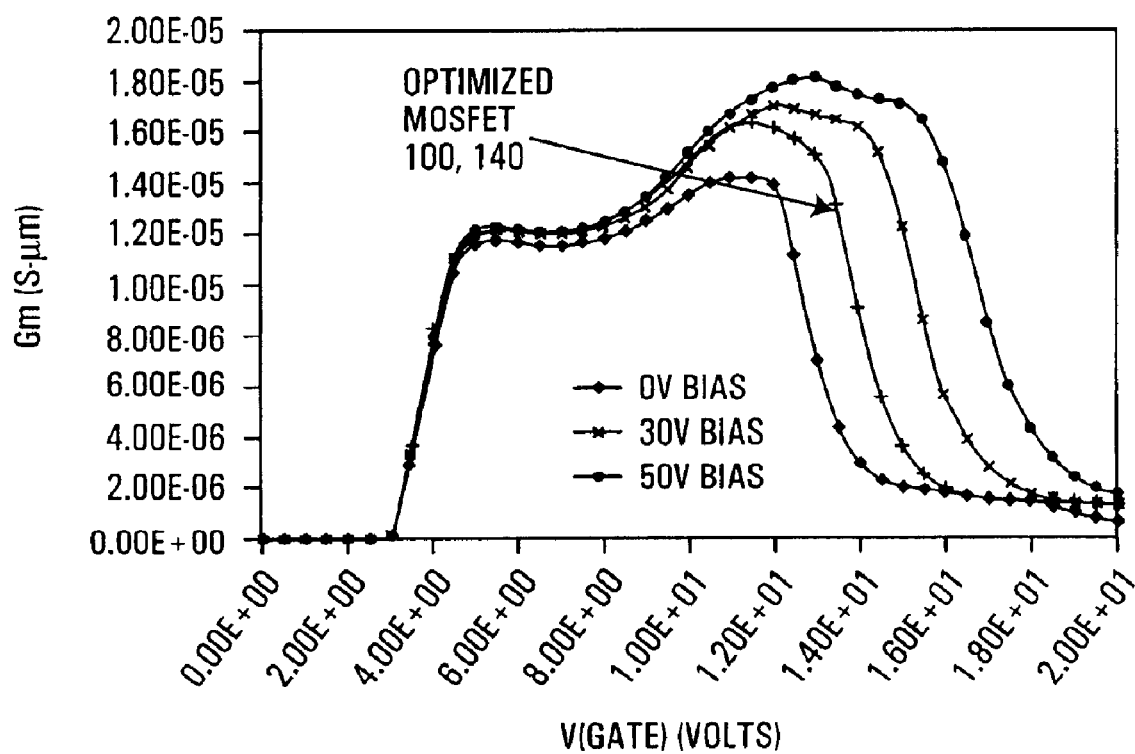
FIGS. 16 and 17 illustrate the relationship of small-signal transconductance gains and bandwidth to gate voltage for the MOSFETs of FIGS. 2A and 13.
Figure 17:
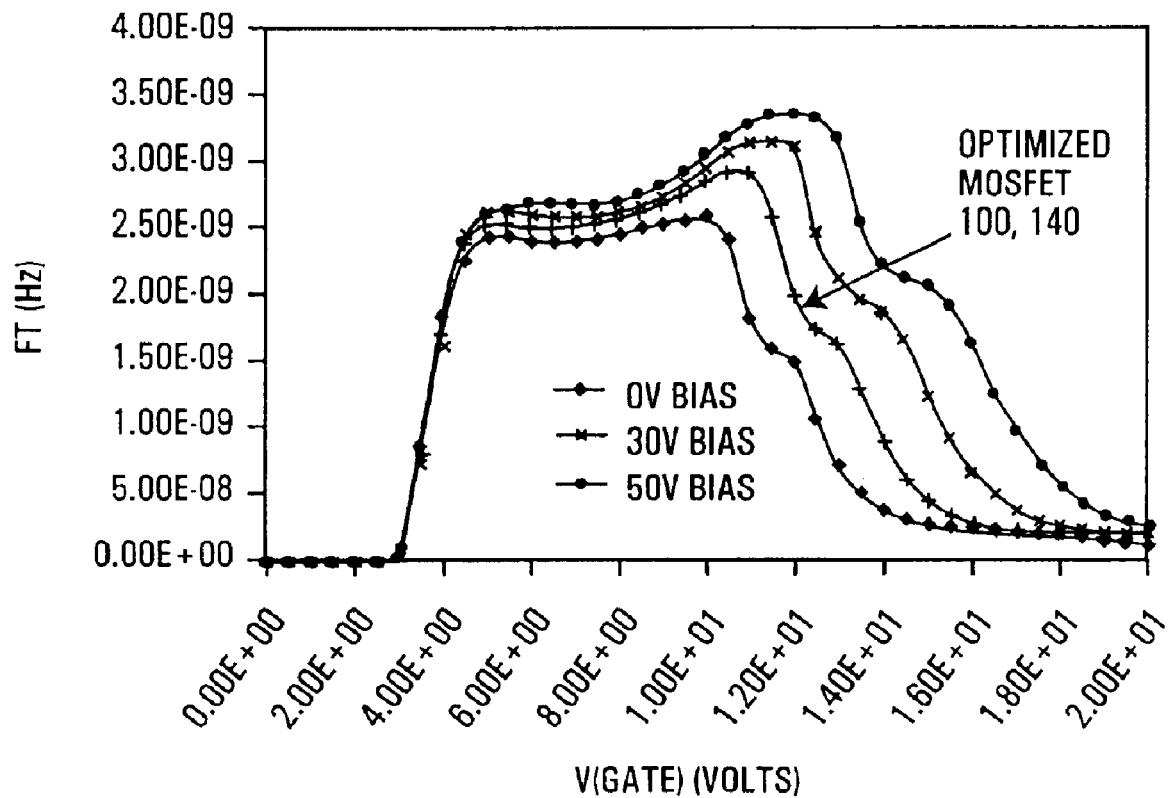

FIGS. 16 and 17 illustrate $G_m$ vs. V(Gate) curve and $F_T$ vs. V(Gate) curve of MOSFETs 100, 140 with $N_d = 7 \times 10^{15}$ cm$^{-3}$ and MOSFET 200 for various control voltages, with $N_d = 5 \times 10^{15}$ cm$^{-3}$, at given $V_{ds} = 30V$ and small signal source frequency of 1 MHz. As illustrated, both families of curves show a larger operational range of the gate voltage under higher control bias.

Of course, the above described embodiments, are intended to be illustrative only and in no way limiting. The described embodiments of carrying out the invention, are susceptible to many modifications of form, arrangement of parts, details and order of performance.

The invention may, for example, be used in both vertically arranged MOSFET structures as described or similar, and in lateral structures where drain and source layers are both located on top of the wafer surface. For application in lateral structures, the dielectric column may be placed in lateral orientation to be along the lateral drift region. Regardless of the orientation of the dielectric, the functional principles on sidewall field exertion and modulation of the breakdown field in the drift region remain the same.

The proposed invention can be applied to power MOSFETs made of materials other than silicon. It may also be used in p-channel MOSFETs.

The invention, rather, is intended to encompass all such modification within its scope, as defined by the claims.

What is claimed is:

1. A power metal oxide semiconductor field effect transistor (MOSFET), comprising:
    a source region;
    a drain region;
    a gate;
    a body region;
    a drift region extending between said bad region and said drain region, to at least partially guide current from said drain region to said source region;
    a dielectric wall formed of an insulator, said dielectric wall having opposing sides, one of its opposing sides extending in contact with said drift region, and an opposite one of its opposing sides connected to a low-resistance conducting region, isolated from said drain region by portion of said dielectric wall so that a voltage across said dielectric wall between its opposing sides exerts an electric field into said drift region to redistribute free carriers in said drift region and thereby affect the electrical field distribution in said drift region to increase the breakdown voltage of a reverse biased semiconductor junction between said drift region and said body region;
    wherein said dielectric wall is formed having a thickness tox, so that the relationship $N_d \approx [(\epsilon_{si} \cdot E_0^2 \cdot \epsilon_{ox}^{4/3})/(2 \cdot q^{7/3})]^{5/7} \cdot [t_{ox} \cdot w]^{-4/7}$ is satisfied, where $N_d$ is the concentration of dopant in said drift region, 2w is a width of said drift region, $\epsilon_{ox}$ is the dielectric constant for said dielectric wall, $\epsilon_{si}$ is the dielectric constant for said drift region, $E_0$ is the electric field avalanche value for said drift region and q is the electron charge.

2. The MOSFET of claim 1, further comprising another dielectric wall formed of an insulator, and having opposing sides, one of its opposing sides extending adjacent a second side of said drift region, and an opposite one of its opposing sides connected to a low-resistance conducting region, isolated from said drain region by a portion of said another dielectric wall so that a voltage across said another dielectric wall between its opposing sides exerts an electric field into said drift region to redistribute free carriers in said drift region and thereby affect the electrical field distribution in said drift region to increase the breakdown voltage of a reverse biased semiconductor junction between said drift region and said body region.

3. The MOSFET of claim 1, wherein said dielectric wall comprises an oxide insulator.

4. The MOSFET of claim 3, wherein said oxide insulator comprises a single or multi-layer oxide insulator.

5. The MOSFET of claim 1, wherein a ratio of said thickness of said dielectric wall and a half-width of said low-resistance conducting region connected to one of its opposite side, to a half width of said drift region is approximately 4:3.

6. The MOSFET of claim 1, further comprising an electrical contact, electrically connecting said source region and said low-resistance conducting region.

7. The MOSFET of claim 1, wherein said low-resistance conducting region comprises a poly-silicon layer along an extent of said opposite one of said opposing sides of said dielectric wall.

8. The MOSFET of claim 1, wherein said low-resistance conductive region comprises a polysilicon.

9. An n-channel or p-channel power metal oxide semiconductor field effect transistor (MOSFET), comprising:
    a source region;
    a drain region;
    a gate;
    a body region;
    a drift region extending between said body region and drain region, to at least partially guide carriers from said source region to said drain region;
    two dielectric columns formed of a substantially insulating material, each having opposing sides, one opposing side of each of said two dielectric columns extending in contact with said drift region, and an opposite one of said opposing sides of each of said dielectric columns electrically connected to a low-resistance conducting region, each low resistance conducting region isolated from said drift region and said drain region by one of said dielectric columns, so that a voltage across each of said two dielectric columns between its opposing sides exerts an electric field into said drift region to redistribute free carriers in said drift region and thereby affect the electrical field distribution in said drift region to increase the
    breakdown voltage of a reverse biased semiconductor junction between said drift region and said body region;

wherein each of said dielectric columns is formed having a thickness tox, so that the relationship $N_d \approx [(\epsilon_{si} \cdot E_0^2 \cdot \epsilon_{ox}^{4/3})/(2 \cdot q^{7/3})]^{3/7} \cdot [t_{ox} \cdot w]^{-4/7}$ is satisfied, where $N_d$ is the concentration of dopant in said drift region, 2w is a width of said drift region, $\epsilon_{ox}$ is the dielectric constant for each of said dielectric columns, $\epsilon_{si}$ is the dielectric constant for said drift region, $E_0$ is the electric field avalanche value for said drift region and q is the electron charge.

10. A power metal oxide semiconductor field effect transistor (MOSFET), comprising:
   a source region;
   a drain region;
   a gate;
   a body region;
   a uniformly doped drift region extending between said body region and said drain region, to at least partially guide current from said drain region to said source region;
   a dielectric wall formed of an insulator, said dielectric wall having opposing sides, one of its opposing sides extending in contact with said drift region, along the entire extent of said drift region between said drain region and said source region, and an opposite one of its opposing sides connected to a low-resistance conducting region, isolated from said drain region by a portion of said dielectric wall and having a thickness so that a voltage across said dielectric wall between its opposing sides exerts an electric field into said drift region to redistribute free carriers in said drift region and thereby affect the electrical field distribution in said drift region to increase the breakdown voltage of a reverse biased semiconductor junction between said drift region and said body region.

11. The MOSFET of claim 10, further comprising another dielectric wall formed of an insulator, and having opposing sides, one of its opposing sides extending adjacent a second side of said drift region, and an opposite one of its opposing sides connected to a low-resistance conducting region, isolated from said drain region by a portion of said another dielectric wall so that a voltage across said another dielectric wall between its opposing sides exerts an electric field into said drift region to redistribute free carriers in said drift region and thereby affect the electrical field distribution in said drift region to increase the breakdown voltage of a reverse biased semiconductor junction between said drift region and said body region.

12. The MOSFET of claim 10, wherein said dielectric wall comprises an oxide insulator.

13. The MOSFET of claim 12, wherein said oxide insulator comprises a single or multi-layer oxide insulator.

14. The MOSFET of claim 10, wherein said dielectric wall is formed having a thickness tox, so that the relationship $N_d \approx [(\epsilon_{si} \cdot E_0^2 \cdot \epsilon_{ox}^{4/3})/(2 \cdot q^{7/3})]^{3/7} \cdot [t_{ox} \cdot w]^{-4/7}$ is satisfied, where $N_d$ is the concentration of dopant in said drift region, 2w is a width of said drift region, $\epsilon_{ox}$ is the dielectric constant for said dielectric wall, $\epsilon_{si}$ is the dielectric constant for said drift region, $E_0$ is the electric field avalanche value for said drift region and q is the electron charge.

15. The MOSFET of claim 14, wherein a ratio of said thickness of said dielectric wall and a half-width of said low-resistance conducting region connected to one of its opposite side, to a half width of said drift region is approximately 4:3.

16. The MOSFET of claim 10, further comprising an electrical contact, electrically connecting said source region and said low-resistance conducting region.

17. The MOSFET of claim 10, wherein said low-resistance conducting region comprises a poly-silicon layer along an extent of said opposite one of said opposing sides of said dielectric wall.

18. The MOSFET of claim 10, wherein said low-resistance conductive region comprises a polysilicon.

* * * * *

UNITED STATES PATENT AND TRADEMARK OFFICE
CERTIFICATE OF CORRECTION

PATENT NO. : 6,853,033 B2
DATED : February 8, 2005
INVENTOR(S) : Liang et al.

It is certified that error appears in the above-identified patent and that said Letters Patent is hereby corrected as shown below:

Column 9,
Line 54, "said bad region"; should read -- said body region --

Signed and Sealed this

Seventh Day of June, 2005

JON W. DUDAS
*Director of the United States Patent and Trademark Office*